United States Patent
Nagao et al.

(10) Patent No.: US 8,420,431 B2
(45) Date of Patent: Apr. 16, 2013

(54) SOLAR CELL

(75) Inventors: Nobuaki Nagao, Gifu (JP); Takahiro Hamada, Osaka (JP); Akio Matsushita, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/460,525

(22) Filed: Apr. 30, 2012

(65) Prior Publication Data

US 2012/0211073 A1 Aug. 23, 2012

Related U.S. Application Data

(63) Continuation of application No. PCT/JP2011/003098, filed on Jun. 2, 2011.

(30) Foreign Application Priority Data

Jun. 7, 2010 (JP) .................................. 2010-129762

(51) Int. Cl.
   *H01L 21/00* (2006.01)
(52) U.S. Cl.
   USPC ....................... 438/57; 257/E31.019; 136/256
(58) Field of Classification Search .................... 438/57; 257/E31.019; 136/256
   See application file for complete search history.

(56) References Cited

U.S. PATENT DOCUMENTS
2010/0320450 A1  12/2010  Fujioka

FOREIGN PATENT DOCUMENTS

| JP | 2007-324224 | 12/2007 |
|---|---|---|
| JP | 2007-324324 | 12/2007 |
| JP | 2009-49209 | 3/2009 |
| JP | 2009-200207 | 9/2009 |

OTHER PUBLICATIONS

Kohda, S., et al., "Nitride semiconductor thin films grown on highly-oriented pyrolytic graphite substrate by MOCVD", Extended Abstracts, The 70th Autumn Meeting, 2009, p. 327 8p-F-3, 2 pages, The Japan Society of Applied Physics No. 1.
Jani, Omkar, et al., "Design and Characterization of GaN/InGaN solar cells", Applied Physics Letters, 2007, 3 pages, vol. 91 132117.
International Search Report, issued in International Patent Application No. PCT/JP2011/003098, dated Sep. 20, 2011.

*Primary Examiner* — Shaun Campbell
(74) *Attorney, Agent, or Firm* — McDermott Will & Emery LLP

(57) ABSTRACT

A method of fabricating a solar cell includes steps of: forming an amorphous carbon layer, an AlN layer and a first n-type nitride semiconductor layer on the surface of the graphite substrate; forming a mask layer with a plurality of openings on the first n-type nitride semiconductor layer; forming a plurality of second n-type nitride semiconductor layers on the portions of the first n-type nitride semiconductor layer which are exposed by the plurality of openings; forming a plurality of light absorption layers on the plurality of second n-type nitride semiconductor layers; forming a plurality of p-side nitride semiconductor layers on the plurality of the light absorption layers; forming a p-side electrode; and forming an n-side electrode.

13 Claims, 5 Drawing Sheets

SOLAR CELL

This application is a Continuation of International Patent Application No. PCT/JP2011/003098 filed on Jun. 2, 2011, claiming priority of Japanese Patent Application No. 2010-129762 filed on Jun. 7, 2010, the entire contents of both of which are incorporated by reference herein.

TECHNICAL FIELD

The present disclosure relates to a solar cell composed of a nitride semiconductor.

BACKGROUND ART

Recently, a semiconductor element made of a nitride semiconductor such as gallium nitride (GaN) has been researched and developed actively. A semiconductor element composed of nitride semiconductors including aluminum nitride (AlN), gallium nitride (GaN), indium nitride (InN) or mixed crystal thereof absorbs light in a wide wavelength region from ultraviolet or blue to infrared by varying its film composition. Furthermore, the light absorption coefficient of the nitride semiconductor is more than one-hundred times higher than that of silicon that is a material used widely as a semiconductor material for a solar cell. For this reason, as its application, a solar cell using a columnar nitride semiconductor was proposed (for example, Patent Literature 1).

FIG. 8 shows a cross-sectional view of a solar cell made of a columnar nitride semiconductor disclosed in Patent Literature 1. As shown in FIG. 8, the columnar nitride semiconductor disclosed in Patent Literature 1 includes a first electrode 2a provided on the first surface of a substrate 6a, a semiconductor region 8a formed on the second surface of the substrate 6a, a plurality of first nano-columns 12a made of InGaN and formed on the semiconductor region 8a, a plurality of second nano-columns 14a made of InGaN having difference polar character formed on the first nano-columns 12a, and a second electrode 24a provided on the second nano-columns 14a.

The solar cell disclosed in Patent Literature 1 improves conversion efficiency from light energy to electric energy by using the columnar nitride semiconductor, compared to a solar cell using nitride semiconductor composed of stacked films.

In order to improve the conversion efficiency of the solar cell disclosed in Patent Literature 1, a nitride semiconductor film having significantly low defects in the crystal has to be prepared so as to suppress the carrier recombination due to non-radiative transition derived from lattice defects or threading dislocations. For this reason, a single-crystalline substrate such as a sapphire substrate is used, but such a single-crystalline substrate is very expensive.

In order to improve the conversion efficiency from light energy to electric energy, it is necessary to suppress temperature increase of the solar cell. This requires the substrate used for forming the nitride semiconductor to have high thermal-conductivity. However, a thermal conductivity of a single-crystalline substrate such as a sapphire substrate is low.

In order to solve the above-mentioned problems, Patent Literature 2 discloses a method for fabricating a poly-crystalline nitride semiconductor film by a pulse sputtering method on a graphite film, which is available at low cost. A graphite film has high thermal-conductivity. In this method, the graphite film is used as a substrate.

CITATION LIST

Patent Literature

[Patent Literature 1] Japanese Laid-open patent application publication No. 2007-324324.
[Patent Literature 2] Japanese Laid-open patent application publication No. 2009-200207.

SUMMARY

Technical Problem

However, since the GaN film prepared on the graphite substrate by the pulse sputtering method is polycrystalline and has many defects, it fails to be suitable for a solar cell. Furthermore, since the nitride semiconductor film prepared by a sputtering method is damaged severely due to discharged plasma during the film growth, it is well known that the crystal film contains a significant amount of defects. Accordingly, it is very difficult to prepare p-type GaN necessary to prepare a solar cell, by using the pulse sputtering method according to Patent Literature 2.

The purpose of the present disclosure is to provide a high-performance solar cell at low cost with use of a graphite substrate, which is a non-single-crystalline substrate, by a Metal Organic Chemical Vapor Deposition (MOCVD).

Solution to Problem

In order to accomplish above described purpose, one aspect of the present disclosure provides a method of fabricating a solar cell. The method includes steps of performing an oxygen-ashing treatment to the surface of a graphite substrate to form a amorphous carbon layer on the surface of the graphite substrate; forming an AlN layer on the amorphous carbon layer with a MOCVD (Metal Organic Chemical Vapor Deposition) method; forming a first n-type nitride semiconductor layer on the AlN layer; forming a mask layer with a plurality of openings on the first n-type nitride semiconductor layer; forming a plurality of second n-type nitride semiconductor layers on the portions of the first n-type nitride semiconductor layer which are exposed by the plurality of openings; forming a plurality of light absorption layers on the plurality of second n-type nitride semiconductor layers; forming a plurality of p-side nitride semiconductor layers on the plurality of the light absorption layers; forming a p-side electrode electrically connected with the p-side nitride semiconductor layer; and forming a n-side electrode electrically connected with the first n-type nitride semiconductor layer.

In the method, the amorphous carbon layer may have a thickness of not less than 20 nm and not more than 60 nm.

The method may further includes forming a buffer layer including a nitride semiconductor on the AlN layer.

In any of the foregoing methods, the p-side electrode may be a ZnO transparent film.

Another aspect of the present disclosure provides a solar cell including a graphite substrate; an amorphous carbon layer formed on the graphite substrate; an AlN layer formed on the amorphous carbon layer; a first n-type nitride semiconductor layer formed on the AlN layer; a plurality of second n-type nitride semiconductor layers formed on the first n-type nitride semiconductor layer, each of the second n-type nitride semiconductor layers being columnar; a plurality of light absorption layers formed on the plurality of the second n-type nitride semiconductor layers; a plurality of p-side nitride semiconductor layers formed on the plurality of the light absorption layers; a p-side electrode connected electrically to the plurality of the p-type nitride semiconductor layers; and a n-side electrode connected electrically to the first n-type nitride semiconductor layer.

In the solar cell, the amorphous carbon layer may have a thickness of not less than 20 nm and not more than 60 nm.

The solar cell may further includes a buffer layer formed of a nitride semiconductor on the AlN layer.

In any of the foregoing solar cells, the p-side electrode may be a ZnO transparent film.

Another aspect of the present disclosure provides a solar cell including a graphite substrate, an amorphous carbon layer formed on the graphite substrate, an AlN layer formed on the amorphous carbon layer, a first n-type nitride semiconductor layer formed on the AlN layer; and a plurality of columnar semiconductor layers each including a second n-type nitride semiconductor layer, a light absorption layer and a p-side nitride semiconductor layer and formed on the first n-type nitride semiconductor layer.

The present disclosure provides a high-performance solar cell at low cost with use of a graphite substrate, which is a non-single-crystalline substrate.

DESCRIPTION OF EMBODIMENTS

Figure 1:
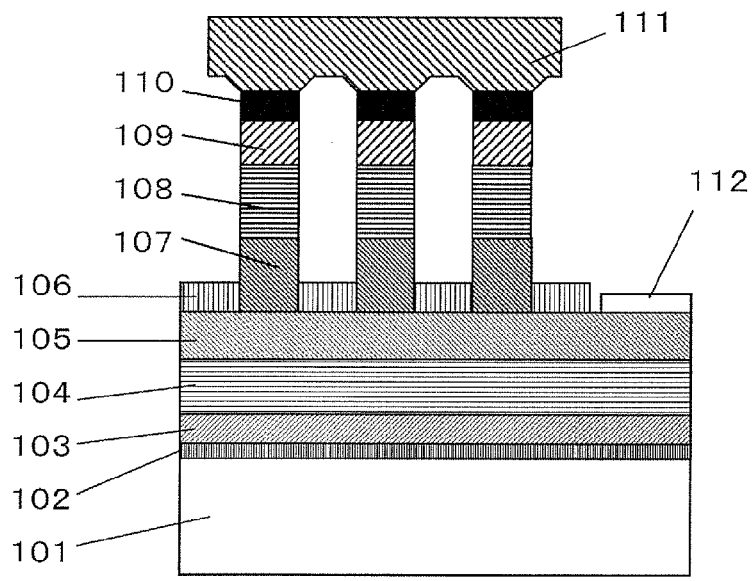
FIG. 1 shows an exemplary cross-sectional view of the solar cell according to embodiment 1.

The embodiments of the present disclosure are described below with reference to the drawings.

In the following description, the same reference numerals are used to designate the same elements and parts, and therefore the overlapping description thereof can be omitted.

FIG. 1 shows an exemplary cross-sectional view of the solar cell according to embodiment 1. As shown in FIG. 1, an amorphous carbon layer 102 is formed on the surface of a graphite substrate 101. The amorphous carbon layer 102 is formed by a treatment of an oxygen-ashing to the surface of the graphite substrate 101. An AlN layer 103 is formed on the amorphous carbon layer 102. The AlN layer 103 may be formed, for example, by a MOCVD method.

A low-temperature growth buffer layer 104 made of GaN is formed on the AlN layer 103. The low-temperature growth buffer layer 104 may be formed by a MOCVD method. A first n-type GaN layer 105 is formed on the low-temperature growth buffer layer 104. A mask layer 106 is formed on the first n-type GaN layer 105. The mask layer 106 has a plurality of openings. A plurality of columnar second n-type GaN layers 107 are formed on the parts of the first n-type GaN 105 which are exposed on the plurality of openings.

A plurality of columnar light-absorption layers 108 made of $In_xGa_{1-x}N$ are formed on the plurality of columnar second n-type GaN layers 107. It is preferred that the value of x is not less than 0.01 and not more than 0.20. As one example, the value of x may be 0.12. A plurality of columnar p-type GaN layers 109 are formed on the plurality of columnar light-absorption layers 108. A plurality of columnar p-type contact layers 110 are formed on the plurality of columnar p-type GaN layers 109. Preferably, the material of the p-type contact layer 110 is GaN. The plurality of columnar p-type GaN layers 109 is electrically connected to a p-side electrode 111 through p-type contact layer 110. An n-side electrode 112 is electrically connected to the first n-type GaN layer 105.

The low-temperature buffer layer 104, the first n-type GaN layer 105, the second n-type GaN layers 107, the light-absorption layers 108, the p-type GaN layers 109, the p-type GaN contact layers 110 are formed by an epitaxial growth method in this order.

It is preferred that all the plurality of columnar p-type contact layers 110 are electrically connected to the p-side electrode 111. An example of the p-side electrode 111 is a transparent conductive film such as an indium tin oxide film or a zinc oxide film, or a laminate composed of a nickel film and a gold film. As one example, the n-side electrode 112 is composed of a titanium and aluminum laminate.

A method for fabricating the above-mentioned solar cell is described below with reference to the drawings.

FIGS. 2A to 2G show cross-sectional views of the steps of the method for fabricating the solar cell according to embodiment 1.

In embodiment 1, an MOCVD method is used as a crystal growth method of a nitride semiconductor. A gallium source includes, for example, trimethylgallium (TMG). An aluminum source includes, for example, trimethylaluminum (TMA). An indium source includes, for example, trimethylindium (TMI). A group-V source (nitrogen source) includes, for example, ammonia ($NH_3$). An n-type dopant source includes silane ($SiH_4$). A p-type dopant source includes, for example, cyclopentadienylmagnesium ($CP_2Mg$).

Figure 2A:
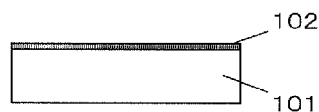
FIGS. 2A to 2G show an exemplary cross-sectional view of the method for fabricating the solar cell according to embodiment 1.
Figure 2B:
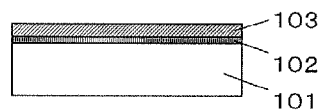
Figure 2C:
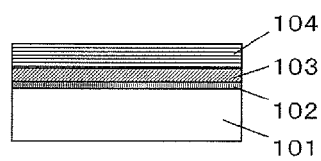

First, as shown in FIG. 2A, the surface of the graphite substrate 101 is oxidized by an oxygen-ashing treatment. Thus, the amorphous carbon layer 102 is formed. Next, as shown in FIG. 2B, the AlN layer 103 is grown by a MOCVD method on the amorphous carbon layer 102 at the temperature of approximately 960 degrees Celsius. Furthermore, as shown in FIG. 2C, a low-temperature growth buffer layer 104 made of GaN is grown at the temperature of approximately 500 degrees Celsius.

Figure 2D:
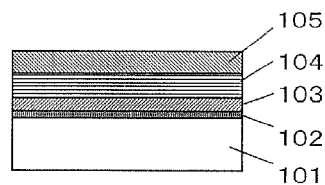
Figure 2E:
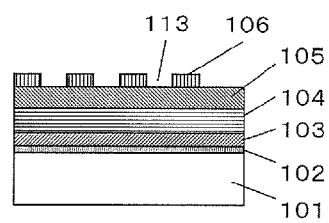

Next, as shown in FIG. 2D, the first n-type GaN layer 105 is formed at a high temperature of approximately 900 degrees Celsius. As shown in FIG. 2E, a mask layer 106 having the plurality of openings is formed on the first n-type GaN layer 105.

Figure 2F:
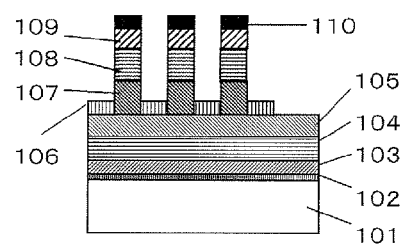

As shown in FIG. 2F, the second n-type GaN layers 107, the light-absorption layers 108, the p-type GaN layers 109, the p-type contact layers 110 are grown at a high temperature of 900 degrees Celsius in this order on the parts of the first n-type GaN layer 105 which are exposed on the openings in the mask layer 106. Thus, columnar structures each composed of the second n-type GaN layer 107, the light-absorption layer 108, and the p-type GaN layer 109 are formed.

Figure 2G:
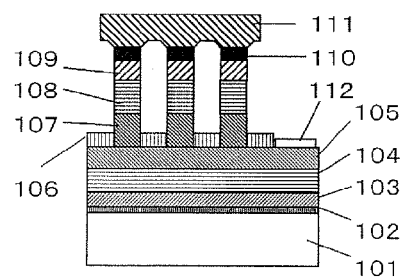

Finally, as shown in FIG. 2G, the p-side electrode 111 is formed. The p-side electrode 111 is in contact with all the plurality of the p-type GaN contact layers 110, each of which is located at the tip of the columnar structure. The n-side electrode 112 is also formed on the first n-type GaN layer 105.

In embodiment 1, the amorphous carbon layer 102 is provided by the oxygen-ashing treatment on the surface of the graphite substrate 101. Furthermore, the AlN layer 103 is formed on the amorphous carbon layer 102 with MOCVD. These allow the fully-dense and c-axis oriented AlN layer 103 to be prepared. Accordingly, the formation of a high quality GaN thin film with a small amount of threading dislocations is achieved, although a graphite substrate, which is not a single-crystalline substrate, is used. This allows a GaN solar cell to be prepared directly on the graphite substrate.

An example of the material of the mask layer 106 is silicon oxide, silicon nitride, or aluminum oxide. These materials are not chemically reactive at a high temperature of 900 degrees Celsius. The mask layer 106 may be formed by an ordinal semiconductor forming process such as a sputtering method or a chemical vapor deposition method.

Example

The present teaching is described in more detail with reference to the following example.

Figure 3A:
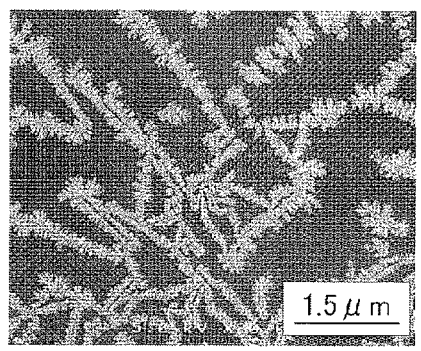
FIG. 3A shows a surface SEM observation image when the AlN was deposited with MOCVD on the graphite substrate which was not provided with an amorphous carbon layer.
Figure 3B:
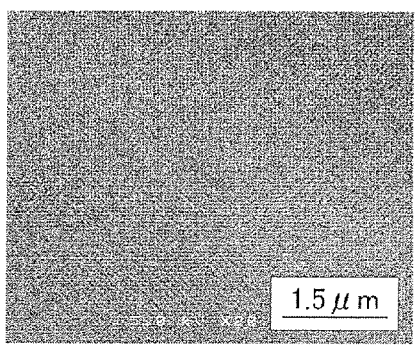
FIG. 3B shows a surface SEM observation image when the AlN was deposited with MOCVD on the graphite substrate which was provided with an amorphous carbon layer.

FIG. 3A shows the surface SEM observation image after AlN was deposited with MOCVD on the graphite substrate having the surface where the oxygen-ashing treatment was not performed. FIG. 3B shows the surface SEM observation image after the AlN layer 103 with a thickness of 20 nanometers was formed with MOCVD on the graphite substrate provided with the amorphous carbon layer 102 with a thickness of 20 nanometers formed by the oxygen-ashing treatment.

As is clear from FIG. 3A, a dense AlN thin film was not formed on the graphite substrate 101 where the oxygen-ashing treatment was not performed. Only a microcrystal such as a dendrite crystal was deposited.

On the contrary, as is clear from FIG. 3B, the dense AlN film was formed on the graphite substrate 101 having the amorphous carbon layer 102 on its surface.

Figure 4A:
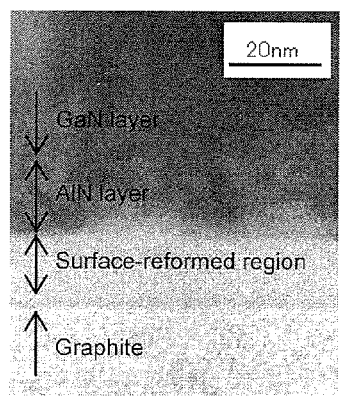
FIG. 4A shows a cross-sectional TEM observation image in the vicinity of the interface between the graphite substrate and the AlN layer in embodiment 1.
Figure 4B:
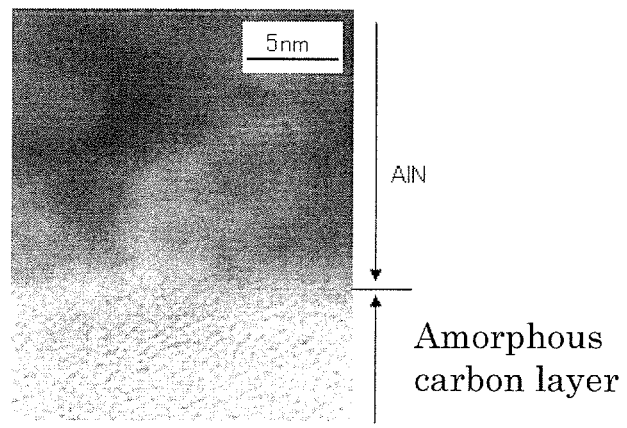
FIG. 4B shows a lattice image at an interface between the graphite substrate and the AlN layer according to a high-resolution TEM.

FIG. 4A shows the cross-sectional TEM observation image of the laminates composed of the amorphous carbon layer 102, which is referred as "Surface-reformed region", the AlN layer 103 with a thickness of 20 nanometers formed with MOCVD, and the low-temperature growth GaN buffer layer 104 with a thickness of 1 micrometer on the graphite substrate 101. FIG. 4B shows the observed lattice image in the vicinity of the interface between the amorphous carbon layer 102 and the AlN layer 103.

As is clear from FIG. 4A and FIG. 4B, the AlN layer 103 having a dense crystallinity was formed on the surface of the amorphous carbon layer 102. The low-temperature growth buffer layer 104 made of GaN having an excellent crystallinity was formed on the AlN layer 103. The dislocation density calculated from the TEM observation was low. Particularly, the dislocation density was $2 \times 10^9$ cm$^{-2}$. This dislocation density is the same degree as that of the GaN thin film formed on a sapphire substrate.

It was discovered that the formation of the nitride thin film with significantly high crystallinity on a graphite substrate was achieved by providing the amorphous carbon layer 102 on the surface of the graphite substrate, which is non-single-crystalline.

Presumably, the reason why the dense AlN thin film is grown by forming the amorphous carbon layer 102 by the oxygen-ashing treatment on the surface of the graphite substrate 101 is explained as below. In an ordinal graphite surface, electrons are delocalized due to pi bonds consisted of the sp$^2$ hybrid orbital of a graphene. On the other hand, in the amorphous carbon layer 102 having the amorphous surface formed by the oxygen-ashing treatment, the pi bonds are fragmented anywhere. As a result, not only sp$^2$ orbital but also sp$^3$ orbital exist on the surface of the surface reformed layer.

Table 1 shows adsorption energies of an Al atom and an N atom with regard to the sp$^2$ orbital and the sp$^3$ orbital of a carbon, which are calculated in accordance with first principle calculation.

TABLE 1

| Adsorption atom | sp$^2$ | sp$^3$ |
| --- | --- | --- |
| N | 447 | −49 |
| Al | 227 | −138 |

Unit: (kcal/mol)

As is clear from Table 1, the adsorption energies of the Al atom and the N atom with regard to sp$^2$ orbital are positive values, while those with regard to sp$^3$ orbital are negative values. This means that Al and N are easy to adsorb to sp$^3$ orbital spontaneously. The amorphous carbon layer 102 is formed by the oxygen-ashing treatment on the surface of the graphite substrate. Presumably, this allows a lot of sp$^3$ orbital of carbon to be formed, and promotes core formation at the initial stage of the AlN growth. As a result, an excellent crystalline film is grown.

Table shows the half-value widths of (0002) peaks obtained with the rocking curve of XRD of the GaN when the amorphous carbon layers with various thicknesses are formed.

TABLE 2

| Film thickness (nm) | Half-value width (arcsec) |
| --- | --- |
| 0 | — |
| 20 | 2700 |
| 40 | 2500 |
| 60 | 3200 |
| 80 | 10500 |

When the thickness of the amorphous carbon layer is not less than 20 nanometers and not more than 60 nanometers, the GaN film is c-axis-oriented and the film with excellent half-value width was obtained. When the thickness of the amorphous carbon layer exceeds about 80 nm, the amount of the oxygen which moved into the graphite thin film during the oxygen-ashing treatment increases. On the subsequent growth of AlN and GaN with MOCVD, the oxygen which has moved into the graphite thin film reacts with Al or Ga. This prevents the formation of the precipitous interface. Accordingly, the thickness of the amorphous carbon layer 102 is preferably not less than 20 nanometers and not more than 60 nanometers.

Table 3 shows the thicknesses of the layers in the example 1.

TABLE 3

| | thickness (nanometer) |
|---|---|
| Amorphous carbon layer | 20 |
| AlN layer | 20 |
| GaN low-temperature growth buffer layer | 4000 |
| First n-type GaN layer | 100 |
| Mask layer | 30 |
| Second n-type GaN layer | 100 |
| Light absorption layer | 100 |
| p-type GaN layer | 200 |
| p-type GaN contact layer | 20 |

The amorphous carbon layer 102, the AlN layer 103, the low-temperature growth GaN buffer layer 104, the first n-type GaN layer 105, the mask layer 106, the plurality of the second n-type GaN layers 107, the plurality of the light absorption layers 108, the plurality of the p-type GaN cladding layers 109, and the plurality of the p-type GaN contact layers 110 were grown in this order as shown in FIGS. 2A-2G.

Figure 5:
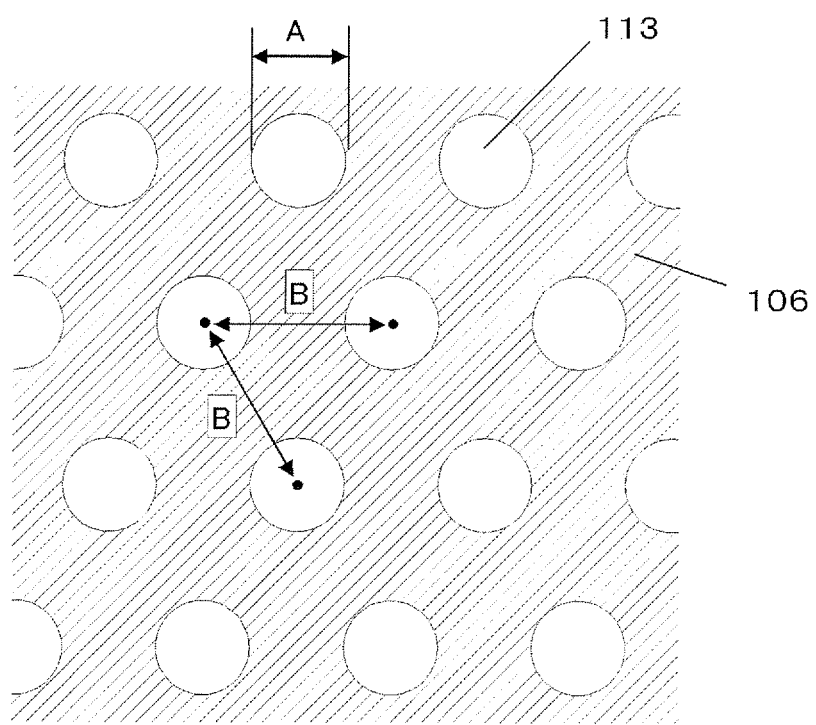
FIG. 5 shows an exemplary schematic top view of a mask layer in the embodiment 1.

The material of the mask layer 106 was $SiO_2$. As shown in FIG. 5, the mask layer 106 had a plurality of openings 113 each having a shape of circle. Each opening 113 had a diameter A of 210 nanometers. The interval B between two adjacent openings 113 was 420 nanometers. The plurality of the columnar structures each having a diameter of 210 nanometers were formed with use of the mask layer 106. The interval between two adjacent columnar structures was 420 nanometers. Each of the columnar structures was composed of the n-type GaN layer, an InGaN layer, and the p-type GaN layer.

The light absorption layer 108 had a composition of $In_{0.12}Ga_{0.88}N$.

The p-side electrode 111 composed of a ZnO transparent conductive film was formed on the p-type GaN contact layer 110 by a liquid phase synthesis method. The method of the liquid phase synthesis is described below.

Hexamethylenetetramine ($(CH_2)_6N_4$) at a concentration of 0.1 mol/L was dropped in a zinc nitrate ($ZnNO_3$) solution at a concentration of 0.1 mol/L, and the pH was adjusted to 5 to 7. A photoresist film was applied onto the solar cell structure to expose only the p-type GaN contact layer 110 by photolithography. Then, the solar cell structure was immersed in the solution and stood still for two to six hours while the solution temperature was maintained at 70 degree Celsius. Thus, a ZnO transparent conductive film was grown on the p-type GaN contact layer. The thickness of the ZnO transparent conductive film was controlled by the growth period. The growth rate was approximately 2.7 nanometers/minute. After the ZnO transparent conductive film was grown, the resist was removed with acetone and the obtained diode was dried.

As the result of UV-visible transmittance measurements, the transmittance of the ZnO transparent conductive film prepared by the above-mentioned process had a high transmittance of not more than 95% in a wide range of not less than 350 nanometers and not more than 2.5 micrometers. Furthermore, as a result of a resistivity measurement by a four-terminal method, the ZnO transparent conductive film had a relatively low resistivity of $1.2 \times 10^{-2}$ ohm·cm. This resistivity means that the resultant ZnO transparent conductive film is sufficiently usable as a transparent electrode.

A titanium film with a thickness of 10 nanometers and an aluminum film with a thickness of 10 nanometers were stacked to form the n-side electrode 112. Subsequently, each element was divided with a dicer to prepare the solar cell according to example 1 with a size of 1 millimeter×1 millimeter. As comparative example 1, the solar cell identical to that of the example 1 was prepared except that the mask layer 106 was not formed.

Figure 6:
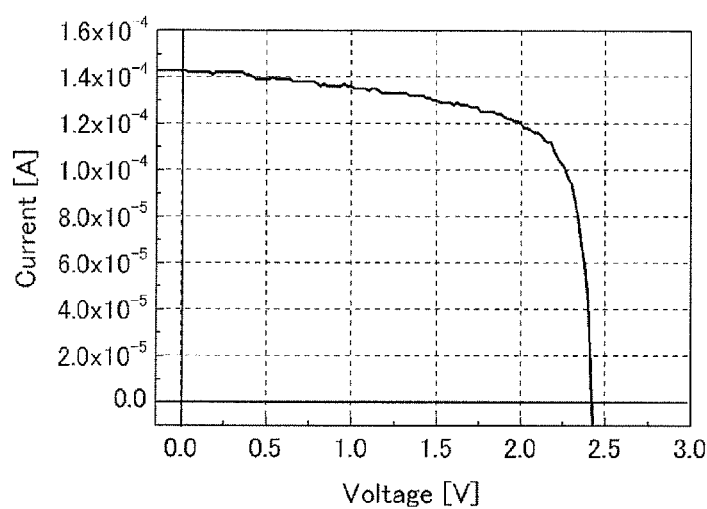
FIG. 6 is a graph showing an I-V property of the solar cell prepared on the graphite substrate according to embodiment 1.

FIG. 6 shows the I-V property of the solar cell according to example 1. As is clear from FIG. 6, the solar cell according to example 1 had an excellent property. The short-circuit current was $1.43 \times 10^{-4}$ ampere, the open voltage thereof was approximately 2.44 volts, and the fill factor FF thereof was approximately 0.8.

Figure 7:
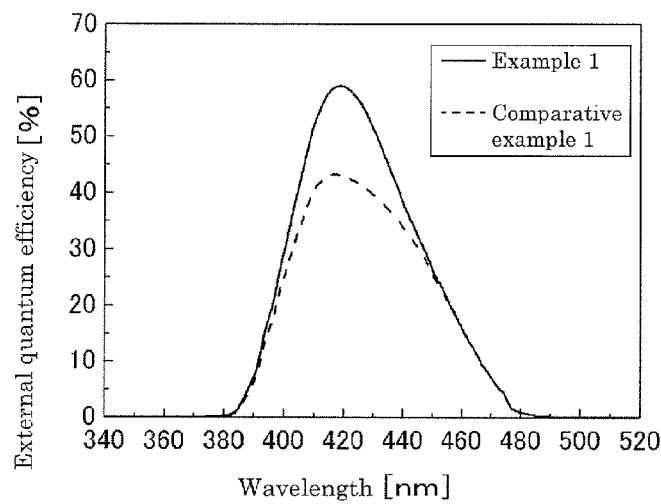
FIG. 7 is a graph showing the spectral sensitivity property of the solar cell prepared on the graphite substrate according to embodiment 1.
Figure 8:
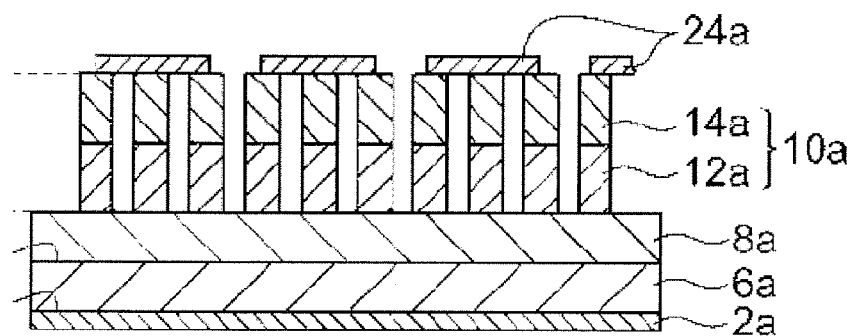
FIG. 8 shows a cross-sectional view of a conventional solar cell.

FIG. 7 shows the spectral sensitivity properties of the solar cells according to example 1 and comparative example 1. The external quantum efficiency was measured with use of a spectral sensitivity device (commercially-available from BUNKOUKEIKI Co., Ltd, trade name: CEP-25ML, DC mode).

As is clear from FIG. 7, the maximum external quantum efficiency was obtained in the vicinity of 420 nanometers due to the absorption peak of the $In_{0.12}Ga_{0.88}N$ layer, which was the light absorption layer 108. The light absorption layer of example 1 had 1.32 times greater quantum efficiency than that of the comparative example 1.

As understood from these results, in the present disclosure, the amorphous carbon layer is formed on the graphite substrate, and then the AlN layer is formed by a MOCVD method. This allows the columnar GaN with excellent crystallinity to be formed. Thus, the high-performance solar cell can be prepared at low cost.

The light absorption layer of the example 1 is composed of $In_xGa_{1-x}N$ (x=0.12); however, x may be not less than 0.01 and not more than 0.20.

The mask layer of the example 1 had the plurality of the openings each having a diameter of 210 nanometers. Two adjacent openings had an interval of 420 nanometers. However, a skilled person can configure the diameter and the interval appropriately in such a manner that the diameter and the interval correspond to the adsorption wavelength of the light adsorption layer which decided by the composition of the $In_xGa_{1-x}N$ layer.

INDUSTRIAL APPLICABILITY

The solar cell of the present disclosure has the AlN layer and the GaN layer each having excellent crystallinity formed by a MOCVD method on the graphite substrate, and is useful as a low-cost and high-performance solar cell. The technology of the solar cell of the present disclosure can also be applied to an electric device such as a high-frequency device or a FET for a power device,

| [Reference Signs List] | |
|---|---|
| 2a: | first electrode |
| 6a: | substrate |
| 8a: | semiconductor region |
| 10a: | nano-column |
| 12a: | first nano-column |
| 14a: | second nano-column |
| 24a: | second electrode |
| 101: | graphite substrate |
| 102: | amorphous carbon layer |
| 103: | AlN layer |
| 104: | low-temperature growth buffer layer |
| 105: | first n-type GaN layer |
| 106: | mask layer |
| 107: | second n-type GaN layer |
| 108: | light-absorption layer |
| 109: | p-type GaN layer |
| 110: | p-type GaN contact layer |
| 111: | p-side electrode |
| 112: | n-type electrode |
| 113: | opening |

The invention claimed is:

1. A method of fabricating a solar cell, the method comprising steps of:
   performing an oxygen-ashing treatment to a surface of a graphite substrate to form an amorphous carbon layer on the surface of the graphite substrate;
   forming an AlN layer on the amorphous carbon layer by a Metal Organic Chemical Vapor Deposition (MOCVD) method;
   forming a first n-type nitride semiconductor layer on the AlN layer;
   forming a mask layer with a plurality of openings on the first n-type nitride semiconductor layer;
   forming a plurality of second n-type nitride semiconductor layers on portions of the first n-type nitride semiconductor layer which are exposed by the plurality of openings;
   forming a plurality of light absorption layers on the plurality of second n-type nitride semiconductor layers;
   forming a plurality of p-side nitride semiconductor layers on the plurality of the light absorption layers;
   forming a p-side electrode electrically connected with the p-side nitride semiconductor layer; and
   forming an n-side electrode electrically connected with the first n-type nitride semiconductor layer.

2. The method of claim 1, wherein
   the amorphous carbon layer has a thickness of not less than 20 nm and not more than 60 nm.

3. The method of claim 1 further comprising:
   forming a buffer layer including a nitride semiconductor on the AlN layer.

4. The method of claim 2 further comprising:
   forming a buffer layer including a nitride semiconductor on the AlN layer.

5. The method of claim 1, wherein
   the p-side electrode is a ZnO transparent conductive film.

6. The method of claim 4, wherein
   the p-side electrode is a ZnO transparent conductive film.

7. The method of claim 1, wherein
   each of the second n-type nitride semiconductor layers is columnar.

8. A solar cell comprising:
   a graphite substrate;
   an amorphous carbon layer formed on the graphite substrate;
   an AlN layer formed on the amorphous carbon layer;
   a first n-type nitride semiconductor layer formed on the AlN layer;
   a plurality of second n-type nitride semiconductor layers formed on the first n-type nitride semiconductor layer, each of the second n-type nitride semiconductor layers being columnar;
   a plurality of light absorption layers formed on the plurality of the second n-type nitride semiconductor layers;
   a plurality of p-side nitride semiconductor layers formed on the plurality of the light absorption layers;
   a p-side electrode connected electrically to the plurality of the p-type nitride semiconductor layers; and
   an n-side electrode connected electrically to the first n-type nitride semiconductor layer.

9. The solar cell of claim 8, wherein
   the amorphous carbon layer has a thickness of not less than 20 nm and not more than 60 nm.

10. The solar cell of claim 8, further comprising
    a buffer layer includes a nitride semiconductor on the AlN layer.

11. The solar cell of claim 9, further comprising
    a buffer layer includes a nitride semiconductor on the AlN layer.

12. The solar cell of claim 8, wherein
    the p-side electrode is a ZnO transparent conductive film.

13. The solar cell of claim 11, wherein
    the p-side electrode is a ZnO transparent conductive film.

* * * * *